United States Patent
Santi et al.

(10) Patent No.: US 8,264,058 B2
(45) Date of Patent: Sep. 11, 2012

(54) MOS-DRIVER COMPATIBLE JFET STRUCTURE WITH ENHANCED GATE SOURCE CHARACTERISTICS

(75) Inventors: Enrico Santi, Columbia, SC (US);
Zhiyang Chen, Columbia, SC (US);
Alexander Grekov, West Columbia, SC (US)

(73) Assignee: University of South Carolina, Columbia, SC (US)

( * ) Notice: Subject to any disclaimer, the term of this patent is extended or adjusted under 35 U.S.C. 154(b) by 295 days.

(21) Appl. No.: 12/704,631

(22) Filed: Feb. 12, 2010

(65) Prior Publication Data
US 2010/0207126 A1 Aug. 19, 2010

Related U.S. Application Data

(60) Provisional application No. 61/207,619, filed on Feb. 13, 2009.

(51) Int. Cl.
*H01L 29/772* (2006.01)
(52) U.S. Cl. ............... 257/504; 257/287; 257/E29.314; 257/E21.403; 257/E21.407; 438/186
(58) Field of Classification Search ............... 257/287, 257/504, E29.314, E21.403, E21.407; 438/186
See application file for complete search history.

(56) References Cited

U.S. PATENT DOCUMENTS

| 5,321,283 | A | 6/1994 | Cogan et al. |
| 5,543,643 | A | 8/1996 | Kapoor |
| 7,268,378 | B1 | 9/2007 | Yu et al. |
| 2007/0284628 | A1* | 12/2007 | Kapoor ............... 257/270 |
| 2008/0093636 | A1* | 4/2008 | Vora et al. ............ 257/256 |
| 2009/0014719 | A1* | 1/2009 | Shimizu et al. ...... 257/49 |
| 2009/0189228 | A1* | 7/2009 | Zhang et al. ......... 257/402 |
| 2011/0049563 | A1* | 3/2011 | Oh et al. ............... 257/140 |

* cited by examiner

*Primary Examiner* — N Drew Richards
*Assistant Examiner* — Peter Bradford
(74) *Attorney, Agent, or Firm* — Dority & Manning, P.A.

(57) ABSTRACT

A MOSFET driver compatible JFET device is disclosed. The JFET device can include a gate contact, a drain contact, and a source contact. The JFET device can further include a first gate region of semiconductor material adjacent the gate contact and a second region of semiconductor material adjacent the first gate region. The first gate region and the second gate region can form a first p-n junction between the first gate region and the second gate region. The JFET device can further include a channel region of semiconductor material adjacent the source contact. The channel region and the second gate region can form a second p-n junction between the second gate region and the channel region.

18 Claims, 5 Drawing Sheets

MOS-DRIVER COMPATIBLE JFET STRUCTURE WITH ENHANCED GATE SOURCE CHARACTERISTICS

PRIORITY CLAIM

This application claims the benefit of priority of U.S. Provisional Patent Application No. 61/207,619, filed Feb. 13, 2009, which is incorporated by reference herein in its entirety for all purposes.

STATEMENT OF GOVERNMENT INTEREST

The present invention was developed with funding from the Office of Naval Research/DARPA under award N00014-07-1-0611. Therefore, the government retains certain rights in this invention.

BACKGROUND

The present disclosure relates generally to junction field effect transistors (JFETs), and more particularly to gate region structures for JFETs.

A JFET is a field effect transistor device that provides the capability of modulating current through a channel region between the drain and the source of the JFET. The current through the channel region is controlled by adjusting the voltage applied to a p-n junction proximate the gate of the JFET. In normally off JFETs, or enhancement mode JFETs, the depletion width of the p-n junction typically extends all the way across the channel region of the JFET when about 0V is applied to the gate. Application of a positive voltage to the gate forward biases the p-n junction and reduces the width of the depletion region in the channel region. This creates a conduction path for current in the channel region between the source and drain of the JFET. In this regard, a normally off JFET can be used as a controllable switch for power electronics applications.

FIG. 1 depicts a conventional normally off JFET device 100. As illustrated, JFET device 100 includes a source terminal 110, a drain terminal 120, and a gate terminal 130. Source terminal 110 is coupled to source contacts 112. Drain terminal 120 is coupled to drain contact 122. Gate terminal 130 is coupled to gate contacts 132. A gate region 140 of semiconductor material is adjacent each gate contact 132. A channel region 150 of semiconductor material is disposed between adjacent gate regions 140 and under source contact 112. A drift region 160 of semiconductor material is disposed between, on one side, gate regions 140 and channel regions 150, and, on the other side, drain contact 122.

JFET device 100 illustrated in FIG. 1 is an n-channel normally off JFET such that channel region 150 and drift region 160 are n-type semiconductor materials. Gate region 140 is of a p-type semiconductor material to form a p-n junction 145 between gate region 140 and channel region 150. Another p-n junction 146 is formed between gate region 140 and drift region 160. P-n junction 145 has a depletion region 155 with a depletion width that extends across channel region 150 when a 0V is applied to gate contact 132. When the voltage applied to gate contact 132 reaches a threshold voltage, p-n junction 145 becomes forward-biased and the width of depletion region 155 is reduced. This creates a channel in channel region 150 for conduction of current between drain contact 122 and source contact 112.

Conventional normally off JFETs, such as silicon carbide (SiC) JFETs, turn on at low threshold gate voltages, such as at about 1V, and are fully on at low gate voltages, such as at about 3V. These voltage levels are not compatible with conventional MOSFET gate drivers, which operate between about 0V (off-state) and about 15V (on-state). The threshold voltage of a conventional normally off SiC JFET of about 1V is so low that it is not safe to use a normally off SiC JFET with a MOSFET gate driver in power electronics applications, where noise could be higher than about 1V. Additionally, a 15V gate voltage would cause the p-n junction between gate and source to conduct a very large current, which can cause significant losses and defect propagation and subsequent device failure in the SiC material. In this regard, a specially designed gate driver is typically required for operation of SiC JFETs, which limits the application of JFETs in power electronics.

In a conventional normally off JFET, the gate source region forms a p-n junction which conducts a gate source current when the p-n junction is forward biased. The gate source current can be about 50 mA or even higher, which causes power losses in WET driver circuits. Moreover, the p-n junction in a conventional normally off JFET is almost fully forward biased when the JFET is turned on and the width of the depletion region of the p-n junction is very thin. The thin depletion region between the gate and channel can introduce a high gate source capacitance, which can limit dynamic performance of the JFET significantly.

Thus, there is a need for a normally off SiC JFET structure that is compatible with MOSFET drivers that overcomes the above-mentioned disadvantages.

SUMMARY

Aspects and advantages of the invention will be set forth in part in the following description, or may be obvious from the description, or may be learned through practice of the invention.

One embodiment of the present disclosure is directed to a JFET device that includes a gate contact, a drain contact, and a source contact. The JFET device includes a first gate region of semiconductor material adjacent the gate contact and a second region of semiconductor material adjacent the first gate region. The first gate region and the second gate region form a first p-n junction between the first gate region and the second gate region. The JFET device further includes a channel region of semiconductor material adjacent the source contact. The channel region and the second gate region form a second p-n junction between the second gate region and the channel region. The first p-n junction has a depletion width that is adjustable based at least in part on a gate voltage applied to the gate contact.

In a variation of this exemplary embodiment, the second p-n junction can have a depletion width that is adjustable based at least in part on the gate voltage. In another variation of this exemplary embodiment, the depletion width of the second p-n junction can decrease as the depletion width of the first p-n junction increases when the gate voltage is greater than a threshold voltage for the first p-n junction.

In another variation of this exemplary embodiment, the first gate region can be an n-type semiconductor material and the second gate region can be a p-type semiconductor material. In yet another variation of this exemplary embodiment, the second gate region can have a higher doping concentration than the channel region.

In a further variation of this exemplary embodiment, the second gate region can have a first side adjacent the channel region and a second side adjacent a drift region of semiconductor material. The drift region and the second gate region can form a third p-n junction between the drift region and the second gate region. In a variation of this exemplary embodiment, the first side of the second gate region can have a thickness that is less than a thickness of the second side of the second gate region. In another variation of this exemplary embodiment, the first side of the second gate region can have a thickness that is approximately equal to the sum of the depletion width of the first p-n junction and the depletion width of the second p-n junction when a 0V is applied to the gate contact and to the source contact.

In still a further variation of this exemplary embodiment, the first gate region, the second gate region, and the channel region can comprise a silicon carbide material.

Another exemplary embodiment of the present disclosure is directed to a JFET device that includes a gate contact, a drain contact, and a source contact. The JFET device includes a first gate region of semiconductor material adjacent the gate contact and a second region of semiconductor material adjacent the first gate region so that a first p-n junction is formed between the first gate region and the second gate region. The JFET device further includes a channel region of semiconductor material adjacent the source contact and the second gate region so as to form a second p-n junction between the second gate region and the channel region. The JFET device further includes a drift region of semiconductor material disposed adjacent the drain contact, the channel region, and the second gate region so as to form a third p-n junction between the second gate region and the drift region. In a variation of this exemplary embodiment, the second gate region can at least partially surround the first gate region.

Another exemplary embodiment of the present disclosure is directed to a normally off SiC JFET device. The normally off SiC JFET device includes a gate contact, a source contact, and a drain contact. The normally off SiC JFET device includes an n gate region of n-type semiconductor material adjacent the gate contact and a p gate region of p-type semiconductor material partially surrounding the n gate region. The p gate region and the n gate region form a first p-n junction between the p gate region and the n gate region. The normally off SiC JFET device further includes an n channel region of n-type semiconductor material adjacent the source contact and the p gate region. The n channel region and the p gate region form a second p-n junction between the n channel region and the p gate region. The normally off SiC JFET device further includes an n drift region of n-type semiconductor material adjacent the drain contact, the n channel region, and the p gate region. The n drift region and the p gate region form a third p-n junction between the n drift region and the p gate region.

In a variation of this exemplary embodiment, the SiC JFET device has a threshold voltage of about 6V. In another variation of this exemplary embodiment, the p gate region is substantially depleted when a gate voltage of about 6V is applied to the gate contact. In still another variation of this exemplary embodiment, the n channel region is substantially undepleted when a gate voltage of about 15V is applied to the gate contact.

Other variations and modifications can be made to these exemplary embodiments of the present disclosure.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

DETAILED DESCRIPTION

Figure 1:
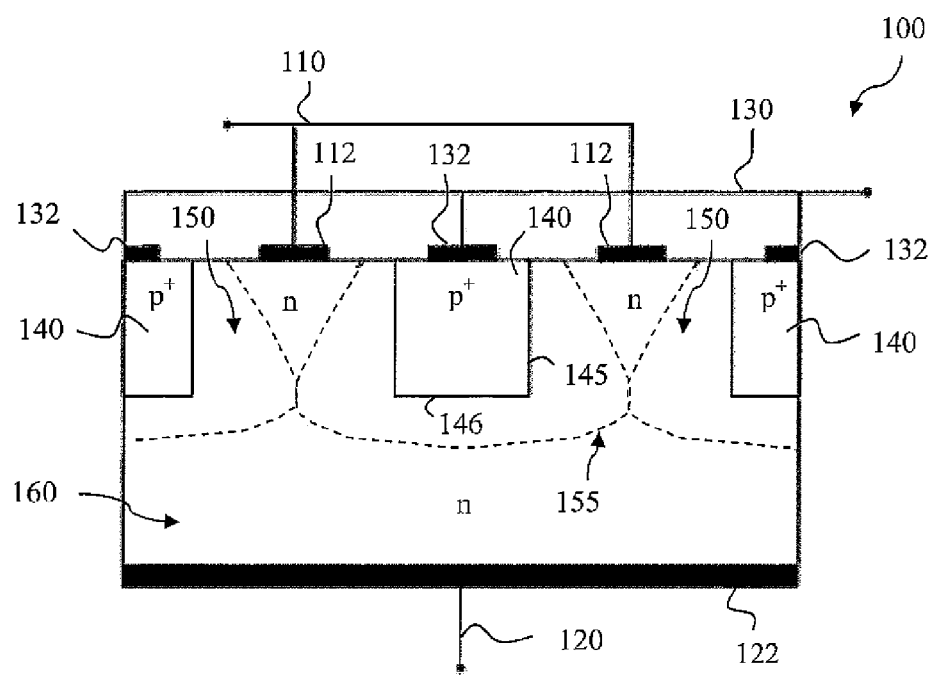
FIG. 1 depicts an exemplary known normally off JFET structure.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

In general, the present disclosure is directed to a normally off JFET structure that is compatible with MOSFET driver circuits. The normally off JFET structure includes a gate contact, a source contact, and a drain contact. The normally off JFET structure includes a first gate region of semiconductor material adjacent the gate contact and a second gate region of semiconductor material adjacent the first gate region so as to form a first p-n junction between the first gate region and the second gate region. A channel region is disposed adjacent the second gate region to form a second p-n junction between the second gate region and the channel region.

The JFET structure according to embodiments of the present disclosure can provide for a normally off JFET with a threshold voltage in the range of about 3V to about 6V, and a fully on voltage of about 15V and can block high drain voltage. The JFET structure provides for a reduced gate current when the JFET is fully on and can provide for reduced gate source capacitance and gate drain capacitance. Moreover, when the JFET is in a fully on condition, a larger channel region can be used for current conduction. In view of the above characteristics, the JFET structure according to embodiments of the present disclosure can provide for a normally off SiC JFET that is compatible with MOSFET driver circuits and can be used in power electronics applications.

The JFET structure according to embodiments of the present disclosure is applicable to any JFET device. While the present disclosure is made with reference to an n-channel normally off JFET device, those of ordinary skill in the art, using the disclosures provided herein, should readily understand that the present disclosure is equally applicable to other JFET devices, such as p-channel JFET devices, vertical JFET devices, planar JFET devices, Si JFET devices, SiC JFET devices, normally on JFET devices, and normally off JFET devices.

Figure 2:
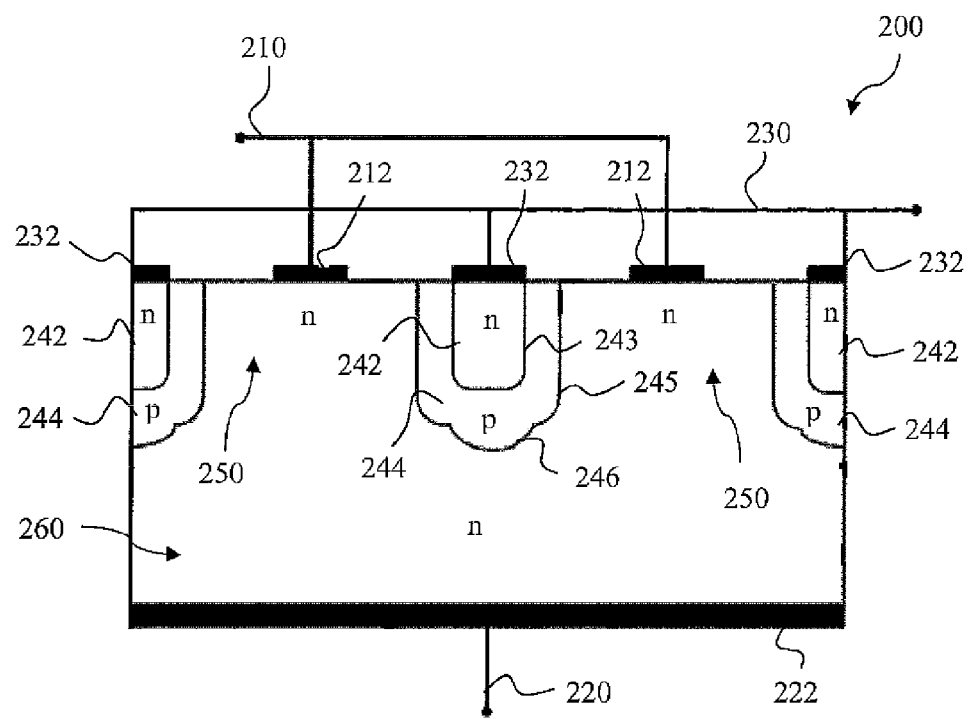
FIG. 2 depicts an exemplary JFET structure according to an exemplary embodiment of the present disclosure.

FIG. 2 illustrates an exemplary JFET device 200 according to an exemplary embodiment of the present disclosure. As illustrated, JFET device 200 includes a source terminal 210, a drain terminal 220, and a gate terminal 230. Source terminal 210 is coupled to source contacts 212. Drain terminal 220 is coupled to drain contact 222. Gate terminal 230 is coupled gate contacts 232. An n gate region 242 of n-type semiconductor material is disposed adjacent the gate contacts 232. A p gate region 244 of p-type semiconductor material is disposed adjacent the n gate region 242 and partially surrounds n gate region 242. A first p-n junction 243 is formed between the n gate region 242 and the p gate region 244.

An n channel region 250 of n-type semiconductor material is disposed between source contacts 212 and drain contact 260. N channel region 250 is adjacent to p gate region 244 so that a second p-n junction 245 is formed between n channel region 250 and p gate region 244. An n drift region 260 is adjacent to drain contact 222, n channel region 250, and p gate region 244 so as to form a third p-n junction 246 between the p gate region 244 and the n drift region 260.

The doping concentration of p gate region 233 is much higher than the doping concentration of n channel region 250, such that the depletion region of second p-n junction 245 is mostly in n channel region 250. When a 0V is applied to gate contact 232, the depletion width of the depletion region associated with second p-n junction 245 extends across n channel region 250 which prevents current from flowing through n channel region 250 from drain contact 222 to source contact 212.

As illustrated in FIG. 2, p gate region 244 has first side adjacent n channel region 250 and a second side adjacent n drift region 260. The thickness of the p gate region 244 at the second side adjacent n drift region 260 is much thicker than the thickness of the first side of p gate region 244 adjacent n channel region 250. The thick p gate region 244 at the second side adjacent n drift region 260 is designed to support high drain voltage when the JFET is pinched off. When a high voltage is applied to drain contact 222, the depletion region of third p-n junction 246 between p gate region 244 and n drift region 260 will shield n channel region 250 from a high electric field. Most high voltage applied on drain contact 222 can be supported by third p-n junction 246 between p gate region 244 and n drift region 260. Therefore, p gate region 244 at the first side adjacent n channel region 250 is protected from high reverse-bias voltage between drain contact 222 and source contact 212.

Figure 3:
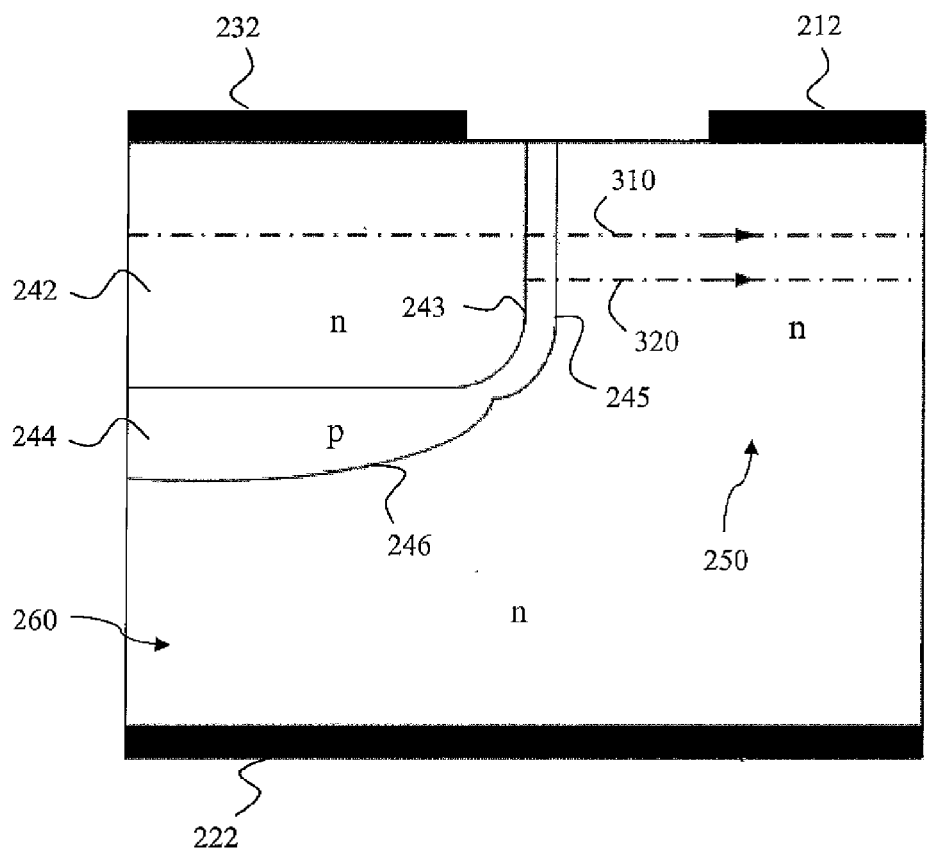
FIG. 3 depicts a close up view of an exemplary JFET structure according to an exemplary embodiment of the present disclosure.
Figure 4:
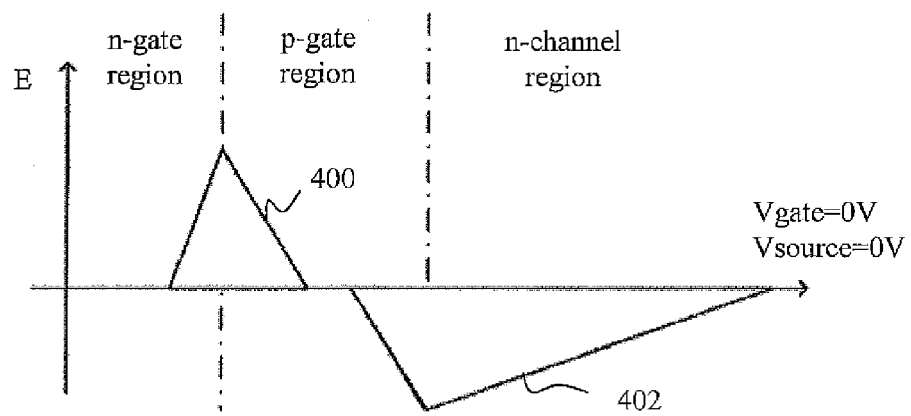
FIG. 4 depicts a graphical representation of electric field plotted along line 310 of FIG. 3 when a 0V is applied to the gate contact and to the source contact.

With reference now to FIG. 3, the JFET device 200 will now be discussed in more detail. When a 0V is applied to gate contact 232 and to source contact 212, n channel region 250 is completely pinched off by the depletion width of the depletion region associated with second p-n junction 245 between p gate region 244 and n channel region 250. The electric field along cut line 310 when a 0V is applied to gate contact 232 and source contact 212 is illustrated in FIG. 4. Curve 400 of FIG. 4 represents the electric field in n gate region 242 and a portion of p gate region 244. Curve 402 shows the electric field in a portion of p gate region 244 and n channel region 250.

Figure 5:
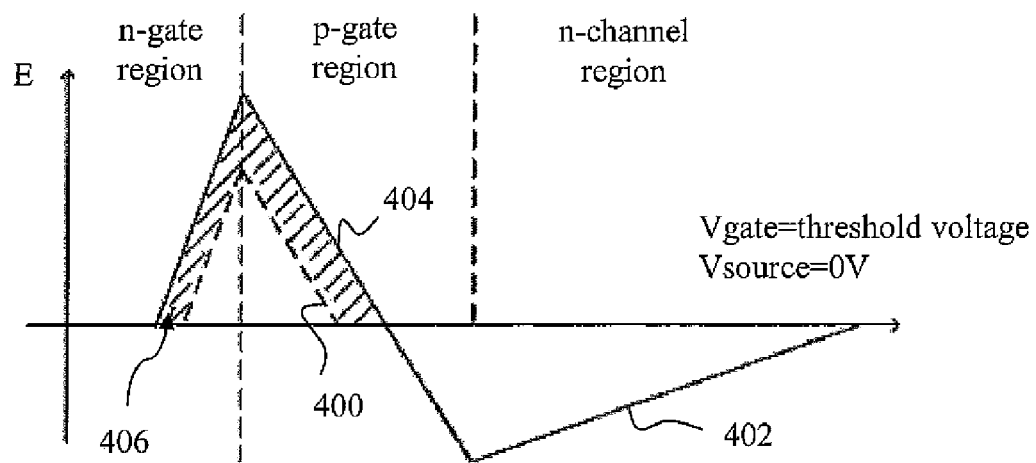
FIG. 5 depicts a graphical representation of electric field plotted along line 310 of FIG. 3 when a threshold voltage is applied to the gate contact and a 0V is applied to the source contact.

As the voltage applied to gate contact 232 increases, the blocking voltage of first p-n junction 243 between n gate region 242 and p gate region 244 also increases. The depletion width of the depletion region associated with first p-n junction 243 will increase because first p-n junction 243 between n gate region 242 and p gate region 244 is blocking more and more voltage. At one point, p gate region 244 becomes totally depleted. The voltage applied to gate contact 232 at this moment is the threshold voltage of JFET device 200. The electric field distribution at this moment along cut line 310 of FIG. 3 is illustrated in FIG. 5. Curve 404 of FIG. 5 illustrates the electric field in the n-gate region and the p-gate region. The area 406 between curve 400 and curve 404 represents the threshold voltage of JFET device 200.

When the voltage applied to gate contact 232 is higher than the threshold voltage, the positive and negative electric fields in p gate region 244 compete with each other. As a result, the depletion width of the depletion region associated with first p-n junction 243 between n gate region 242 and p gate region 244 keeps increasing, which causes the depletion width of the depletion region in p gate region 244 associated with second p-n junction 245 between p gate region 244 and n channel region 250 to decrease. As the depletion width in p gate region 244 of the depletion region associated with second p-n junction 245 decreases, the depletion width in the n channel region 250 of the depletion region associated with second p-n junction 245 also decreases because the blocking voltage of the second p-n junction 245 decreases. As the depletion width of the depletion region in n channel region 250 reduces, n channel region 250 starts to open for current to flow from drain contact 222 to source contact 212.

When the voltage between n gate region 242 and n channel region 250 is higher than the threshold voltage, p gate region 244 is totally depleted. No carriers exist in p gate region 244. N gate region 242 and n channel region 250 become separated by a region of semiconductor material that is free of carriers. Electrons in n channel region 250 can go through the lowered potential barrier between p gate region 244 and n channel region 250 and are swept across the first p-n junction 243 by an electric field of opposite polarity between n gate region 242 and p gate region 244. Gate current is thus much smaller in JFET device 200 when compared to conventional JFETs because only one carrier type, namely electrons in this exemplary embodiment, participates in gate source current, while both carrier types conduct gate source current in a conventional JFET structure.

Figure 6:
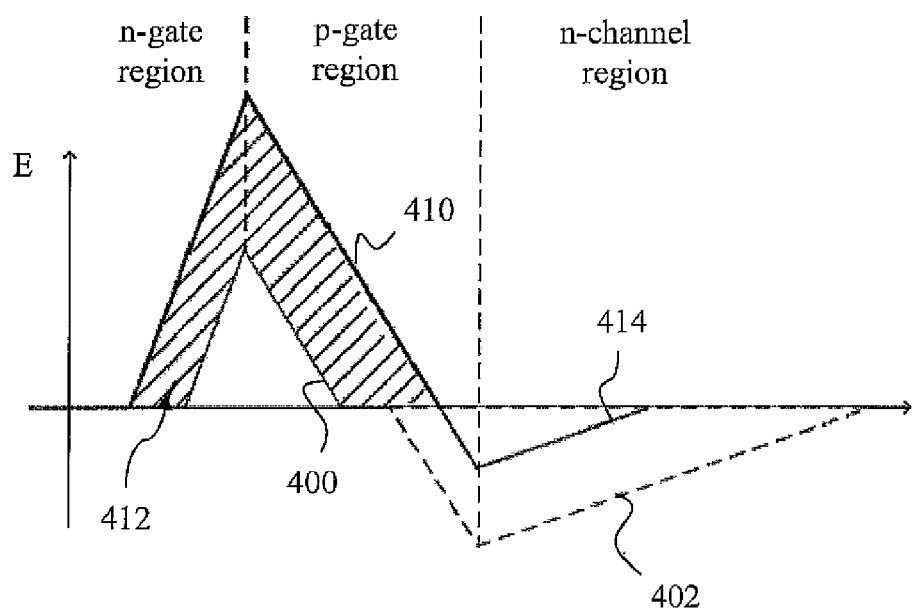
FIG. 6 depicts a graphical representation of electric field plotted along line 310 of FIG. 3 when about 15V is applied to the gate contact.

Eventually, when gate voltage is about 15V, the n channel region 250 is mostly open. The electric field distribution at this moment along cut line 310 of FIG. 3 is illustrated in FIG. 6. Curve 410 of FIG. 6 represents the electric field in n gate region 242 and p gate region 244. Curve 414 shows the electric field in n channel region 250. Area 412 between curve 410 and curve 400 represents the fully open gate voltage. As illustrated, the electric field in n channel region has shifted from curve 402 to curve 414. When the JFET is fully on, the first p-n junction 243 between n gate region 242 and p gate region 244 supports the most voltage applied on gate contact 232. The depletion width of the depletion region associated with second p-n junction 245 between p gate region 244 and n channel region 250 is reduced so that a portion of n channel region 250 is available for current conduction.

Figure 7:
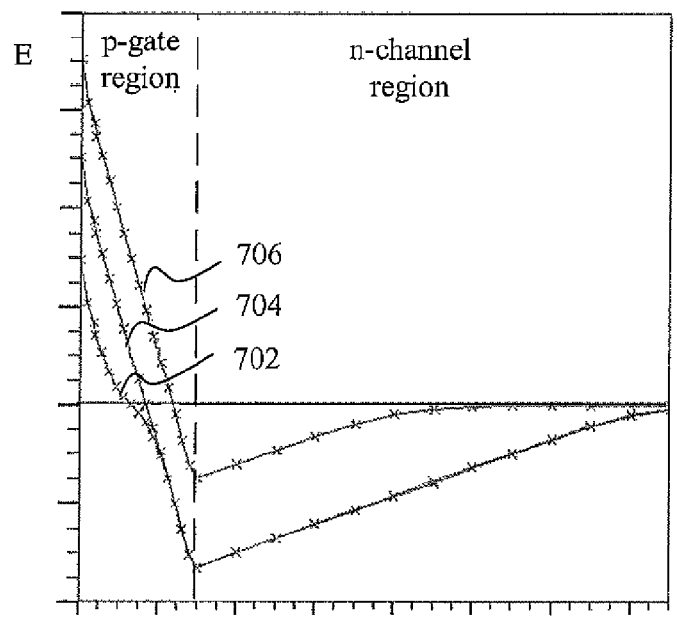
FIG. 7 depicts simulation results for electric field plotted along line 320 of FIG. 3.

A finite element simulation has been performed to determine the electric field distribution along cut line 320 of FIG. 3 in p gate region 244 and n channel region 250 as gate bias voltage increases from 0 volts to 15 volts. FIG. 7 depicts the simulation results. Curve 702 depicts simulation results for when the gate voltage is less than the threshold voltage of JFET device 200. When the gate voltage is smaller than the threshold voltage, p gate region 244 is not completely depleted and n channel region 250 is completely depleted so that JFET 200 is off. Curve 704 depicts simulation results for when the gate voltage is equal to the threshold voltage of JFET device 200. When gate bias is around the threshold voltage, p gate region 244 is completely depleted. Curve 706 depicts simulation results for when the gate voltage is greater than the threshold voltage of JFET device. When the gate voltage is higher than the threshold voltage, a portion of n channel region 250 becomes undepleted, i.e. the n channel region 250 starts to open for conduction. When properly designed, n channel region 250 is fully open when the gate voltage is about 15V.

Figure 8:
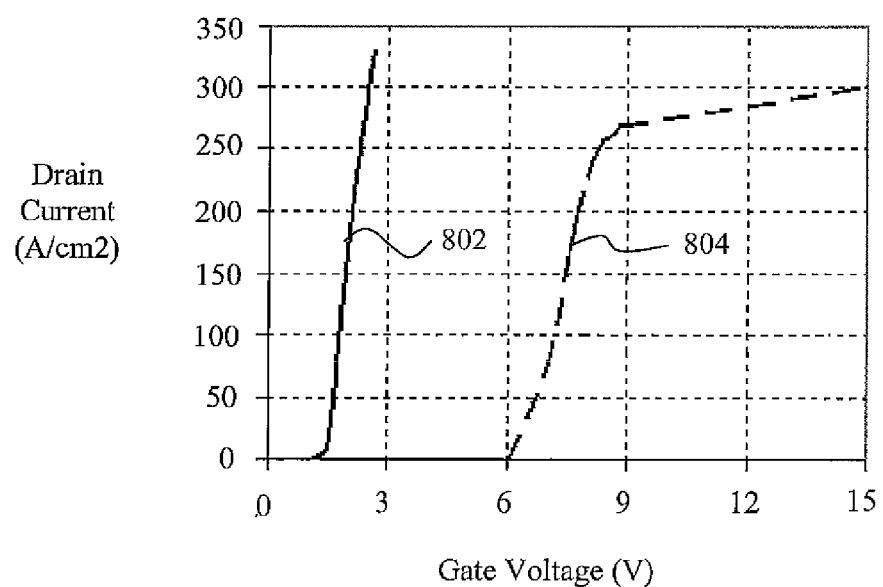
FIG. 8 depicts a transconductance waveform for an exemplary JFET structure according to an exemplary embodiment of the present disclosure.

The transconductance waveform of JFET device 200 is illustrated in FIG. 8. Curve 802 depicts the transconductance waveform of a conventional JFET device. Curve 804 depicts the transconductance waveform of a JFET device according to an exemplary embodiment of the present disclosure. As illustrated, the conventional JFET device turns on at about 1 V, while the JFET device according to an exemplary embodiment of the present disclosure turns on at about 6 V.

Figure 9:
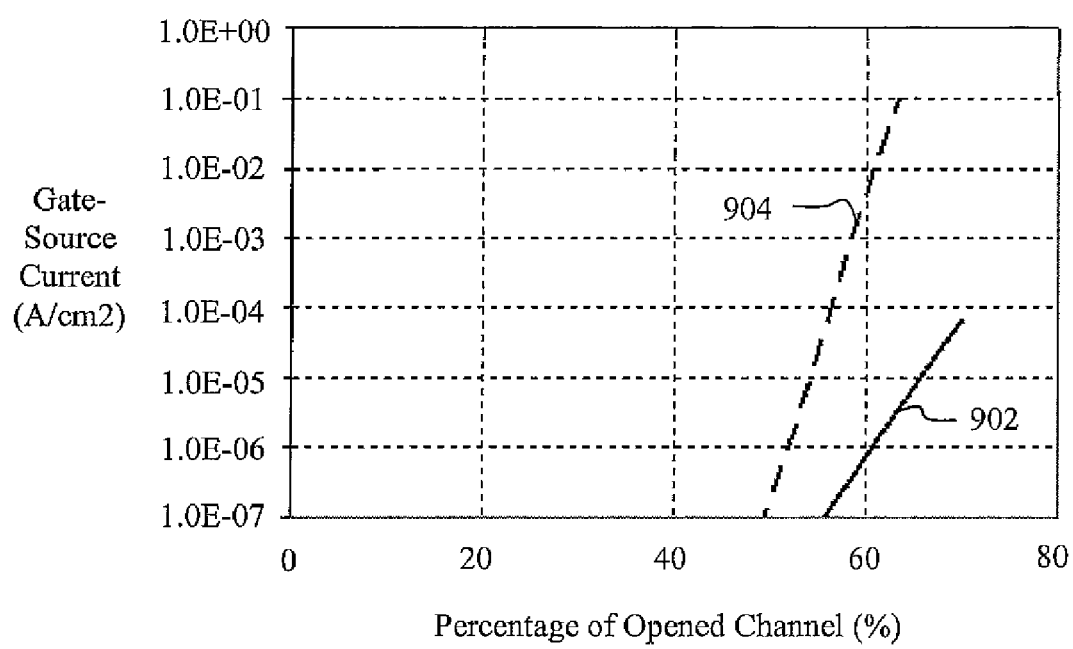
FIG. 9 depicts a graphical representation of gate source current plotted as a function of percentage of opened channel of an exemplary JFET structure according to an exemplary embodiment of the present disclosure.

One of the advantages of the JFET device according to exemplary embodiments of the present disclosure is that only one carrier type can penetrate both first p-n junction 243 and second p-n junction 245. This reduces gate current significantly. This advantage is illustrated in FIG. 9. Curve 904 depicts characteristics of a conventional JFET device while curve 902 depicts characteristics of a JFET device according to an exemplary embodiment of the present disclosure. As illustrated, the gate-source current of the JFET structure according to embodiments of the present disclosure is only a tenth of the gate current of a traditional JFET structure when the n channel region 250 is open more than 50%.

N channel region 250 can open close to 100% if sufficiently high voltage is applied to gate contact 232. Although a high current will go through gate region if the barrier presented by second p-n junction 245 between p gate region 244 and n channel region 250 disappears, the p-n junction 245 barrier can be reduced to a very small value while maintaining a relatively small gate current because only one carrier conducts current from gate contact 232 to source contact 212.

Another advantage of JFET device 200 is that the gate source capacitance and gate drain capacitance can be reduced significantly because the depletion width between n gate region 242 and n channel region 250 and between n gate region 242 and n drift region 260 are increased significantly when compared to conventional JFET devices. Reduced gate source and gate drain capacitance improves dynamic performance of JFET device 200 significantly.

While the present subject matter has been described in detail with respect to specific exemplary embodiments and methods thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A JFET device, comprising:
a gate contact, a drain contact, and a source contact;
a first gate region of semiconductor material, said first gate region having a top surface adjacent said gate contact and one or more interior surfaces;
a second gate region of semiconductor material surrounding each of the one or more interior surfaces of said first gate region, said first gate region and said second gate region forming a first p-n junction between said first gate region and said second gate region such that a single p-n junction is formed between said gate contact and said second gate region;
a channel region of semiconductor material adjacent said source contact, said channel region and said second gate region forming a second p-n junction between said second gate region and said channel region, the first p-n junction and the second p-n junction being located between said gate contact and the channel region;
wherein said first p-n junction has a depletion width that is adjustable based at least in part on a gate voltage applied to said gate contact, said second p-n junction has a depletion width that is adjustable based at least in part on the gate voltage, wherein when the gate voltage is greater than a threshold voltage for the first p-n junction, the depletion width of said second p-n junction decreases as the depletion width of said first p-n junction increases.

2. The JFET device of claim 1, wherein said first gate region is an n-type semiconductor material and said second gate region is a p-type semiconductor material.

3. The JFET device of claim 2, wherein said second gate region has a higher doping concentration than said channel region.

4. The JFET device of claim 1, wherein said second gate region has a first side adjacent said channel region and a second side adjacent a drift region of semiconductor material, said drift region and said second gate region forming a third p-n junction between said drift region and said second gate region.

5. The JFET device of claim 3, wherein said first side of said second gate region has a thickness that is less than a thickness of said second side of said second gate region.

6. The JFET device of claim 3, wherein said first side of said second gate region has a thickness that is approximately equal to the sum of the depletion width of said first p-n junction and said second p-n junction when a zero voltage is applied to said gate contact and said source contact.

7. The JFET device of claim 1, wherein said first gate region, said second gate region, and said channel region comprise a silicon carbide material.

8. A JFET device, comprising:
a gate contact, a drain contact, and a source contact;
a first gate region of semiconductor material, said first gate region having a top surface adjacent said gate contact and one or more interior surfaces;
a second gate region of semiconductor material surrounding each of the one or more interior surfaces said first gate region so that a first p-n junction is formed between said first gate region and said second gate region such that a single p-n junction is formed between said gate contact and said second gate region;
a channel region of semiconductor material adjacent said source contact and said second gate region so as to form a second p-n junction between said second gate region and said channel region, the first p-n junction and the second p-n junction being located between said gate contact and the channel region; and a drift region of semiconductor material disposed adjacent said drain contact, said channel region, and said second gate region so as to form a third p-n junction between said second gate region and said drift region;

wherein said first p-n junction has a depletion width that is adjustable based at least in part on a gate voltage applied to said gate contact, said second p-n junction has a depletion width that is adjustable based at least in part on the Rate voltage, wherein when the gate voltage is greater than a threshold voltage for the first p-n junction, the depletion width of said second p-n junction decreases as the depletion width of said first p-n junction increases.

9. The JFET device of claim 8, wherein said second gate region at least partially surrounds said first gate region.

10. The JFET device of claim 8, wherein said first gate region is an n-type semiconductor material and said second gate region is a p-type semiconductor material.

11. The JFET device of claim 10, wherein said second gate region has a higher doping concentration than said channel region.

12. The JFET device of claim 8, wherein said second gate region has a first side adjacent said channel region and a second side adjacent said drift region.

13. The JFET device of claim 12, wherein said first side of said second gate region has a thickness that is less than a thickness of said second side of said second gate region.

14. The JFET device of claim 12, wherein said first side of said second gate region has a thickness that is approximately equal to the sum of the depletion width of said first p-n junction and said second p-n junction when a zero voltage is applied to said gate contact and said source contact.

15. A normally off SiC JFET device, comprising:

a gate contact, a drain contact, and a source contact;

an n gate region of n-type semiconductor material, said n gate region having a top surface adjacent said gate contact and one or more interior surfaces;

a p gate region of p-type semiconductor material surrounding each of the one or more interior surfaces of said n gate region, said n gate region and said p gate region forming a first p-n junction between said n gate region and said p gate region such that a single p-n junction is formed between said gate contact and said n gate region;

an n channel region of n-type semiconductor material adjacent said source contact and said p gate region, said n channel region and said p gate region forming a second p-n junction between said n channel region and said p gate region, the first p-n junction and the second p-n junction being located between said gate contact and the n channel region;

an n drift region of n-type semiconductor material adjacent said drain contact, said n channel region, and said p gate region, said n drift region and said p gate region forming a third p-n junction between said n drift region and said p gate region;

wherein said first p-n junction has a depletion width that is adjustable based at least in part on a gate voltage applied to said gate contact, said second p-n junction has a depletion width that is adjustable based at least in part on the gate voltage, wherein when the Rate voltage is greater than a threshold voltage for the first p-n junction, the depletion width of said second p-n junction decreases as the depletion width of said first p-n junction increases.

16. The SiC JFET device of claim 15, wherein said SiC JFET has a threshold voltage of about 6 V.

17. The SiC JFET device of claim 15, wherein said p gate region is substantially depleted when a gate voltage of about 6 V is applied to said gate contact.

18. The SiC JFET device of claim 15, wherein said n channel region is substantially undepleted when a gate voltage of about 15 V is applied to said gate contact.

* * * * *